US007924761B1

(12) United States Patent
Stevens

(10) Patent No.: US 7,924,761 B1
(45) Date of Patent: Apr. 12, 2011

(54) METHOD AND APPARATUS FOR MULTIHOP NETWORK FEC ENCODING

(75) Inventor: James A. Stevens, Lucas, TX (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 1198 days.

(21) Appl. No.: 11/541,461

(22) Filed: Sep. 28, 2006

(51) Int. Cl.
  H04B 7/15 (2006.01)
  H04B 7/185 (2006.01)
  H04L 12/56 (2006.01)
  H04J 3/26 (2006.01)
  H03M 13/00 (2006.01)

(52) U.S. Cl. ........ 370/315; 370/394; 370/473; 370/474; 455/13.1; 714/752; 714/784; 714/786

(58) Field of Classification Search .................. 370/473, 370/312, 390, 394, 252, 328, 315–316, 334–335, 370/474; 714/751–752, 748–749, 746, 772, 714/784, 786, 820; 455/11.1, 13.1
See application file for complete search history.

(56) References Cited

U.S. PATENT DOCUMENTS

| 6,307,487 | B1  | 10/2001 | Luby ............................. 341/50 |
| 6,320,520 | B1  | 11/2001 | Luby ............................. 341/50 |
| 6,373,406 | B2  | 4/2002  | Luby ............................. 341/50 |
| 6,411,223 | B1  | 6/2002  | Haken et al. ................... 341/50 |
| 6,486,803 | B1  | 11/2002 | Luby et al. ..................... 341/50 |
| 6,614,366 | B2  | 9/2003  | Luby ............................. 341/50 |
| 6,728,296 | B1* | 4/2004  | Yung ............................ 375/141 |
| 7,310,761 | B2* | 12/2007 | Cho et al. ..................... 714/748 |
| 7,408,938 | B1* | 8/2008  | Chou et al. ................... 370/394 |
| 7,529,198 | B2* | 5/2009  | Jain et al. .................... 370/256 |
| 2003/0200499 | A1* | 10/2003 | Khayrallah ................... 714/776 |
| 2004/0160943 | A1* | 8/2004  | Cain ............................ 370/351 |
| 2005/0068954 | A1* | 3/2005  | Liu et al. ..................... 370/390 |
| 2006/0251026 | A1* | 11/2006 | Kalhan ........................ 370/335 |
| 2007/0133691 | A1* | 6/2007  | Kozat ....................... 375/240.24 |
| 2007/0177739 | A1* | 8/2007  | Ganguly et al. .............. 380/277 |
| 2007/0217432 | A1* | 9/2007  | Molisch et al. .............. 370/400 |
| 2007/0280233 | A1* | 12/2007 | Bush ........................... 370/390 |
| 2008/0031250 | A1* | 2/2008  | Mehta et al. ................. 370/392 |

OTHER PUBLICATIONS

XORs in the Air: Practical Wireless Network Coding; Sachin Katti, Hariharan Rahul, Wenjun Hu, Dina Katabi, Muriel Medard, Jon Crowcroft; MIT CSAIL, Univ. of Cambridge; *SIGCOMM'06*, Sep. 11-15, Pisa Italy.

Rateless Codes and Big Downloads; Petar Maymounkov and David Mazieres; NYU Department of Computer Science.

Conserving Transmission Power in Wireless Ad Hoc Networks; Javier Gomez, Andrew T. Campbell, Dept. of Electronical Engineering and Center for Telecommunications Research, Columbia University, NY; Mahmoud Naghshineh, Chatschik Bisdikian, IBM T.J. Watson Research Center, Hawthorne, NY; Sep. 9, 2001.

Digital Communications Fundamentals and Applications Second Edition; Bernard Sklar; Communications Engineering Services, Tarzana, California and University of Californica, Los Angeles; © 2001.

N-Scale Architectural Vision.

* cited by examiner

*Primary Examiner* — Kwang B Yao
*Assistant Examiner* — Candal Elpenord
(74) *Attorney, Agent, or Firm* — Matthew J. Evans; Daniel M. Barbieri

(57) ABSTRACT

A reliable delivery protocol for wireless networks, where a source node applies network forward error correction coding such that no transmission is ever repeated, instead all retransmissions and relay transmissions use coded packets further out in the coding sequence so that intermediate and destination nodes can make maximal use of overheard transmissions.

13 Claims, 10 Drawing Sheets

METHOD AND APPARATUS FOR MULTIHOP NETWORK FEC ENCODING

CROSS-REFERENCE TO RELATED APPLICATIONS

[none]

BACKGROUND OF THE INVENTION

1. Field of Invention

The present invention relates generally to the field of reliably delivering data between computing devices in a communications network using coding and decoding and in particular for the reliable delivery of packets in a broadcast wireless networks, such as military tactical radio networks.

2. Description of Related Art

Computing devices in a communications network transfer data by transmitting data into a communications channel at the source and receiving the data at the destination or destinations. The communications channel can be wired or wireless. Noise and other impairments in the media, such as interference from other computing devices, can cause errors in the data. In general, wired communications media, such fiber optic, cause less errors in the transmitted data than wireless communications media, such as radio frequency (RF), although in practice errors can be caused in both types of media.

The reliable delivery of data over error inducing channels has been the subject of considerable research and is well described in the literature. For example, "Digital Communications Fundamentals and Applications" by Bernard Sklar describes the use of redundancy to control errors. Techniques include: (a) error detection and retransmission where the source encodes the data with additional redundancy (parity) so that destinations can detect when data is in error (or has been lost) and request the source to retransmit the in error (or lost) data, (b) forward error correction where the source encodes the data with additional redundancy (or parity) information so that the receiver and correct in error (or lost) data using additional redundancy information, or (c) a combination of both techniques.

A communications network is a collection of computing devices (also called nodes) that exchange data amongst one another using communication channels or links between each other. In general, a network can be described as a matrix where the nodes are represented by the rows and columns of the matrix and the links are represented by the matrix values. For example, the rows of the matrix could represent source nodes, the columns of the matrix could represent destination nodes, and the values in the matrix could represent the probability that data transmitted from a source is received at a destination without being repeated (or relayed) by an intermediate node. A value of 1 would represent a link that causes no errors, a value of 0 would represent a link that always cause data to be in error or lost, and a value between 1 and 0 would indicate a link that sometimes causes data to be bad (in error or lost) and sometimes to be good (received correctly). There may be multiple matrixes representing multiple separate (independent) media in use by the network. Separate: media could be multiple separate wired links or multiple RF frequencies. The matrix is said to represent the topology of a given network.

Links can be point to point for a given media (such as many wired links) in which case the row for a given transmitter node is non-zero for the receiver node and zero for all other nodes. Links can be point-to-multipoint for a given media (such as original Ethernet local area networks or current 802.11 wireless LANs) in which case the row for a given transmitter node has more than one non-zero value to indicate that multiple nodes can receive data with some probability. In general for wireless links, nodes that are closer to a transmitter will receive data with higher probability than nodes that are far away.

Often many nodes have a zero or low probability link to many other nodes in the network. In those cases, the nodes exchange link information to find good routes between nodes so that data can be relayed from source nodes to destination nodes through intermediate nodes (called relay nodes). Such a network is called a multihop network. Often a link probability threshold is chosen, so that links with a probability higher than that threshold are called good links and links with a probability lower than that threshold are called bad links. Nodes with good links between one another are called good neighbors and nodes with bad, but non-zero probability, links between one another are called bad neighbors. Nodes with zero links between one another are not considered neighbors at all.

The transfer of data from a source node to a destination node, either directly or though the use of a relay node (or nodes), is called forwarding. Network routing protocols use good links to build network routing tables used in the forwarding of forwarding of data. Example routing protocols include Routing Information Protocol (RIP) and Open Shortest Path First (OSPF).

A mobile ad-hoc network (MANET) is a self-configuring network of mobile router nodes forming a topology of nodes interconnected by wireless links. The topology could be single hop, fully connected where all nodes are directly reachable by all other nodes across a wireless link, or the topology could be multi-hop, sparsely connected, where some nodes are not directly reachable by all of the other nodes, and packets have to be forwarded through relay nodes. Example wireless nodes include networks used in military tactical operations to interconnect warfighting platforms such as tanks and aircraft.

The Open System Interconnection (OSI) Model is an internationally recognized standard architecture that defines a framework for implementing protocols in seven hierarchical layers. Data is passed from one layer to the next, starting at the application layer in one node, and proceeding to the bottom layer, over the channel to the next node and back up the hierarchy. Layers in the OSI protocol stack include layer 1, the physical layer (signals that represent the information in the channel); layer 2, the MAC layer (data link, transmits data packets from transmitter node to receiver node based on node link addresses); layer 3, the network layer (routes data from source node to destination node using relay nodes as required based on node network address); layer 4, the transport layer (ensures delivery of entire message or file end-to-end from source node to destination node); layer 5, the session layer (starts, stops session); layer 6, the presentation layer (encryption, data conversion); layer 7, the application layer. Layers are omitted in some networks, such as the Internet.

For example, a file transfer of data from a source node to a destination node could consist of data at a source node that is transferred from the source node to a destination node using the File Transfer Protocol (FTP) at layer 7. The FTP data is send down to the Transport Control Protocol (TCP) at layer 4. The TCP data is encapsulated into an Internet Protocol (IP) packet at the source node and then forwarded to the destination node directly if it is one link away or to a relay node if the destination one is more than one link away. The IP packet is encapsulated into an IEEE 802.11 wireless local area network (WLAN) packet to be transferred across the link. The WLAN packet is then handed to the physical layer for actual transmission on the wireless RF media. Typically several neighboring nodes will hear the transmission and the neighboring node that is addressed in the WLAN packet will forward it up the protocol stack. The IP packet is extracted out of the WLAN packet at the intended receiving node. If the IP packet is not at the destination node, the packet is again forwarded toward the destination node. If the IP packet is at the destination node, it is passed up to TCP where the data is extracted and passed to FTP.

The reliable delivery techniques discussed above can be implemented at multiple layers of the OSI model, including typically the physical, data link, network, or transport layers. For example, the Transport Control Protocol (TCP) at layer 4 in a source node adds parity information to data packets that it originates. The TCP data is then examined for errors or missing data when it is received at the destination node. Acknowledgements are then sent back from the destination to the source to request additional new data or the resending of incorrectly received data. This data reliability is considered to be end-to-end (ETE)_between source and destination nodes. The 802.11 WLAN at layers 1 and 2 at a transmitting node also adds parity information to data packets that it transmits across a link. The 802.11 WLAN parity information at layer 1 can be used to correct some errors, but not all errors, in a packet at a receiving node. This is called forward error correction (FEC). The 802.1 WLAN data is examined for uncorrectable errors or missing data when it is received at the neighboring receiving nodes. Acknowledgements are then sent back from a receiver to the transmitter to request additional new data or the resending of incorrectly received data. This data reliability is considered to be hop-to-hop between the transmitting and receiving nodes.

In many networks, such as 802.11 WLAN using omni-directional antennas, many other neighboring nodes other than the intended receiver may receive the transmissions as well. These other neighboring nodes examine the intended receiver address and discard the packet (called an overheard packet) if it is not addressed to them. A packet may be overheard by a node farther long in route from the source to destination but may still be discarded.

A source node may intend to deliver data to a single destination node (unicast delivery), to multiple destination nodes (multicast delivery), or to all nodes in a network (broadcast delivery). Similarly, packets may be intended for transmission across a link to a single neighboring node (unicast transmission), to multiple neighboring nodes (multicast transmission), or to all good neighboring nodes (broadcast transmission).

Reliable delivery of data to a single node (unicast delivery or transmission) is performed using FEC and acknowledgement and retransmission of in error or missing packets. Reliable delivery of data to multiple nodes (multicast delivery or transmission) or all nodes (broadcast delivery or transmission) is also performed using FEC and acknowledgment and retransmission of errored or missing packets. A multicast may have problems over a lossy link in a multicast where each node loses a small number of packets, but overall, over all the nodes, the small losses requires retransmission of a significant number of packets.

Fountain codes, also known as rateless erasure codes, are a class of erasure codes with the property that a potentially limitless sequence of encoding symbols can be generated from a given set of source symbols such that the original source symbols can be recovered from any subset of the encoding symbols of size equal to or only slightly larger than the number of source symbols. Fountain codes help solve retransmission problems for multicasts and have an ability to create an almost endless number of recovery symbols. Fountain codes include raptor codes, LT codes, and online codes. Reed-Solomon codes, an error-correcting code that works by oversampling a polynomial constructed from data, have similar properties but with a smaller number of recovery symbols.

In the prior art, one problem with fountain codes, that is overcome by the present invention, is that the systems employing fountain codes do not take advantage of overheard packets, which increases overhead, hence reduces throughput and increases latency.

Further, current state of the art, involves rateless (e.g. fountain code), sparse graph, erasure code transmissions, and reduce automatic repeat request (ARQ) retransmissions, especially for multicast traffic. In such prior systems, the network FEC coding is either applied end-to-end or hop-by-hop but does not take advantage of overheard packets in multi-hop networks. End-to-end encoding uses ARQ for packets that are not delivered and relay nodes cannot take advantage of overheard packets to improve per-hop reliability, and ultimately throughput and latency. Hop-by-hop encoding sends the entire network encoded block across a single link and then repeats on the next link so that relay nodes cannot take advantage of overheard packets to improve per-hop reliability, throughput and latency.

Consequently, what is lacking in the prior art is a superior way of reliably delivering data to take advantage of overheard packets, in particular during a multicast.

SUMMARY OF THE INVENTION

Accordingly, one feature of the present invention is the use of intermediate relaying nodes to receive a message comprised of packets, transmitted as a series of packet blocks using a rateless erasure code, decoding these packet blocks and encoding the packet blocks again for retransmission, but employing the rateless erasure code sequence in such a manner that the exact same encoded packet block is never retransmitted in the network. Alternatively the present invention uses a rateful code with a long sequence of encoded packets and minimizes the number of repeats through the sequence.

Another feature is to employ these intermediate nodes in the field of ad hoc protocols for routing packets between computing devices in a mobile ad-hoc network (MANET) using Forward Error Correction (FEC) and/or Error-Correcting Code (ECC), collectively error detection and/or correction encoding, and in particular MANETs used for military applications, in particular relating to the TDRS (Tactical Data Radio System) and JTRS (Joint Tactical Radio System).

Yet another feature of the present invention is for an improved method in multicasting for using an erasure FEC, in particular a fountain code within multi-transmitter, multi-cast networks, where, at all times, and in particular upon interruption of a digital packet transmission, no encoded packet is ever transmitted twice in the network, by any node, even at different transmitters. In this way receivers in the network can maximize the use of any overheard packets to improve multicast efficiency.

Advantages of using the present invention include improved overall network throughput by reducing the number of retransmissions required and reduced latency by not having to wait for retransmissions.

The sum total of all of the above advantages, as well as the numerous other advantages disclosed and inherent from the invention described herein, creates an improvement over prior techniques.

The above described and many other features and attendant advantages of the present invention will become apparent from a consideration of the following detailed description when considered in conjunction with the accompanying drawings.

BRIEF DESCRIPTION OF THE DRAWINGS

Detailed description of preferred embodiments of the invention will be made with reference to the accompanying drawings. Disclosed herein is a detailed description of the best presently known mode of carrying out the invention. This description is not to be taken in a limiting sense, but is made merely for the purpose of illustrating the general principles of the invention. The section titles and overall organization of the present detailed description are for the purpose of convenience only and are not intended to limit the present invention.

Figure 1A:
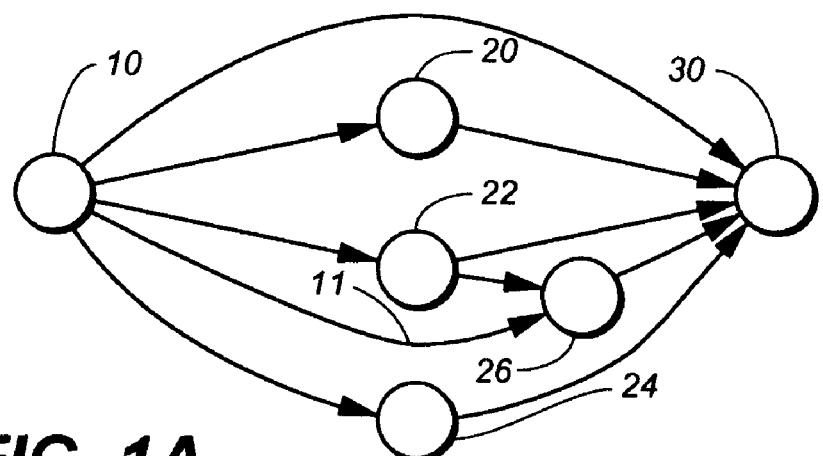
FIGS. 1A and 1B show nodes in representative packet switching network topologies that employ the present invention.

It should be understood that one skilled in the art may, using the teachings of the present invention, vary embodiments shown in the drawings without departing from the spirit of the invention herein. In the figures, elements with like numbered reference numbers in different figures indicate the presence of previously defined identical elements.

DETAILED DESCRIPTION OF THE INVENTION

The present invention is an improved data reliability delivery. The present invention extends the concept of FEC, especially fountain codes to use overheard data (e.g., packets received by neighboring nodes that are not addressed to them but for an different intended receiver node), so that the present invention simulates a network level end-to-end reliability at the hop-by-hop level, and reduces overhead as well.

The present invention is preferably for a single multihop stream of traffic, whether unicast, multicast or broadcast. In the present invention overheard packets are used to improve throughput, but transmitter nodes do not have to know the receiver node state.

The present invention could be extended to multiple streams of traffic from multiple nodes.

The present invention encodes the packets using a type of FEC network coding called erasure code, preferably a fountain code. In a preferred embodiment in the present invention, the present assignee of the present invention, Rockwell Collins, uses fountain code implementations from Digital Fountain.

In the present invention while rateless erasure codes may be the preferred encoding scheme for error detection and/or correction, other types of encoding may be used within the scope of the invention.

The present invention uses intermediate nodes as relaying nodes between the initial transmitting node and the final receiving node. The intermediate nodes employ a fountain code for encoding and decoding message packet blocks, but with the important distinction that when an intermediate node is asked to transmit a packet block, the intermediate relaying nodes always start their transmission in such a way so that the same encoded packet block in the network is never retransmitted twice for relaying (i.e. the identical bits are not retransmitted for the encoded packet block), but a different sequence of bits are transmitted, as a consequence of using a different sequence later in the erasure code (e.g., a fountain code) algorithm used to encode and transmit the packet. The present invention methodology is such that even different transmitters will not retransmit the same packet twice. For example, the transmitter node ID could be used to generate an offset into the encoding sequence.

The present invention uses fountain codes as the preferred coding scheme, but other types of coding schemes may be used. Fountain codes offer great potential to reduce retransmissions and improve reliability for multicast traffic. The present invention includes network encoding at the network layer to further reduce retransmissions and improve reliability for multi-hop traffic as well as at the lower layers to gain improvements from overheard transmissions by third party nodes.

Hop-by-hop (HBH) processing is performed to provide end-to-end reliability with fewer end-to-end transmissions. Network coding (described herein) further reduces end-to-end transmissions for multicast and multi-hop traffic. A hop is a transmission path between two nodes.

Figure 1B:
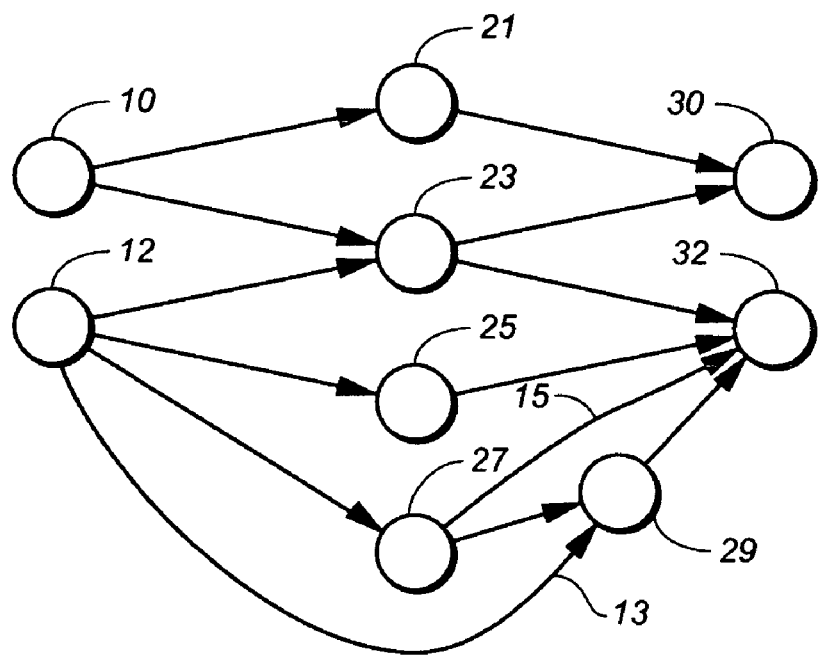

Turning attention to FIGS. 1A and 1B, there are shown nodes in representative packet switching network topologies that employ the present invention. Typically the nodes would be wireless (e.g. radio) transceivers, optimally equipped with omni-directional antennae. FIG. 1A shows a source node 10 that transmits a message in the form of a bitstream comprised of encoded data packets sent to a destination node 30. A plurality of hop-to-hop nodes, such as intermediate nodes (relaying nodes) 20, 22, 24, 26, are disposed between the source node 10 and the destination node 30 and aid in transmitting the packets from one node to the other, as is known per se in the art. Messages in the form of encoded packets travel from node-to-node in the direction of the arrows as shown.

FIG. 1B shows another topology, where a plurality of source nodes 10, 12 exist, which are capable of multicasting (either individually or collectively) to source nodes 30, 32 via intermediate nodes 21, 23, 25, 27 and 29. All the intermediate nodes in the present invention are capable of transmitting and/or receiving (transceiver nodes). The source and destination nodes may also be capable of both transmitting and receiving. In the figures though a directed graph topology is shown (i.e., the World Wide Web is an example of a directed graph, if the files at any source and destination are the vertices and a link from one file to another is a directed edge or arc), in general any topology may employ the present invention, including a directed acyclic graph, a tree, a ring, or any network topology imaginable. Frequently MANETS will spontaneously form a great variety of different configurations. As long as there are intermediate nodes present that function in such a way to transmit and receive binary data to and from a source and destination, the present invention may be employed. These figures show good links between good neighbors. Bad neighbor links are not shown.

The nodes in the MANET may communicate with any other node, and including not just immediate neighbor nodes. Thus node 10 in FIG. 1A may communicate with node 26 directly as shown by the path (edge) 11 rather than, or in addition to, through node 22; likewise in FIG. 1B node 12 may communicate with node 29 via path 13 rather than, or in addition to, through node 27; and node 27 may communicate directly with node 32 through path 15, rather than, or in addition to, node 29. Further, each of these nodes may occasionally receive packets from bad neighboring nodes.

Preferably the nodes in the present invention transmit using packet switched TDMA, and collectively form a MANET, but this is not required. The data transmitted is in the form of binary bits, preferably using TCP/IP over relevant layers of any OSI stack or equivalent. At various points in the transmission the bitstream can be transmitted over not just wire but wirelessly in the radio spectrum, using various transmission schemes of the kind associated with radio frequency (RF) transmission, and employing at the physical layer the wireless 802.11 protocol ("Wi-Fi"), and preferably capable of IP multicasting, with ACK/NAK acknowledgement across data links between network nodes.

In the preferred embodiment of the present invention, the network coding for the packets is a type of Forward Error Correction (FEC) from the class of erasure codes, preferably fountain coding. More generally, the network coding for the data packets can be termed error detection and/or correction encoding (hereinafter error detection-correction encoding), which can include any kind of encoding, including not just rateless erasure codes but Reed Solomon codes, low-density parity-check codes (LDPC codes), and rateful codes with a long sequence, to minimize the number of repeats through the sequence.

Erasure codes are a type of FEC coding where a message of K packets can be encoded with symbols into a stream of N encoded packets (N>K) so that the original message can be recovered from any k subnet of the N encoded packets (k≧K). Erasure codes can be used at higher protocol layers than traditional wireless FEC, which is performed across a single link. The network coding in the instant invention uses erasure codes to reduce the number of multicast transmission. Erasure codes are used to improve multicast efficiency, but are not limited to multicasts in the present invention.

In the present invention, erasure codes are used within multi-transmitter networks comprising a plurality of transmitting and receiving nodes (transceiver nodes, e.g. the intermediate nodes shown in FIGS. 1A and 1B) where no encoded packet from a bitstream is ever transmitted twice (even at different transmitters) so that receivers can maximize use of any overheard packets. Preliminary analysis indicates an additional significant reduction in retransmissions within multi-hop, broadcast RF channels.

Hop-by-hop ACKs may optionally be used in the present invention to achieve a pseudo-reliable multicast. ACK, is the communications code sent from a receiving station to a transmitting station to indicate that it is ready to accept data, and NAK (Negative AcKnowledgement) is the communications code used to indicate that a message was not received, or that a terminal does not wish to transmit. This technique assures that individual transmissions are properly received but does not guarantee the each group member receives the multicast message. Although this approach is not 100%, it does provide a high level of reliability. Reliability is commonly achieved by the sender collecting acknowledgements of some form from each of the receivers to which it transmits.

Figure 2:
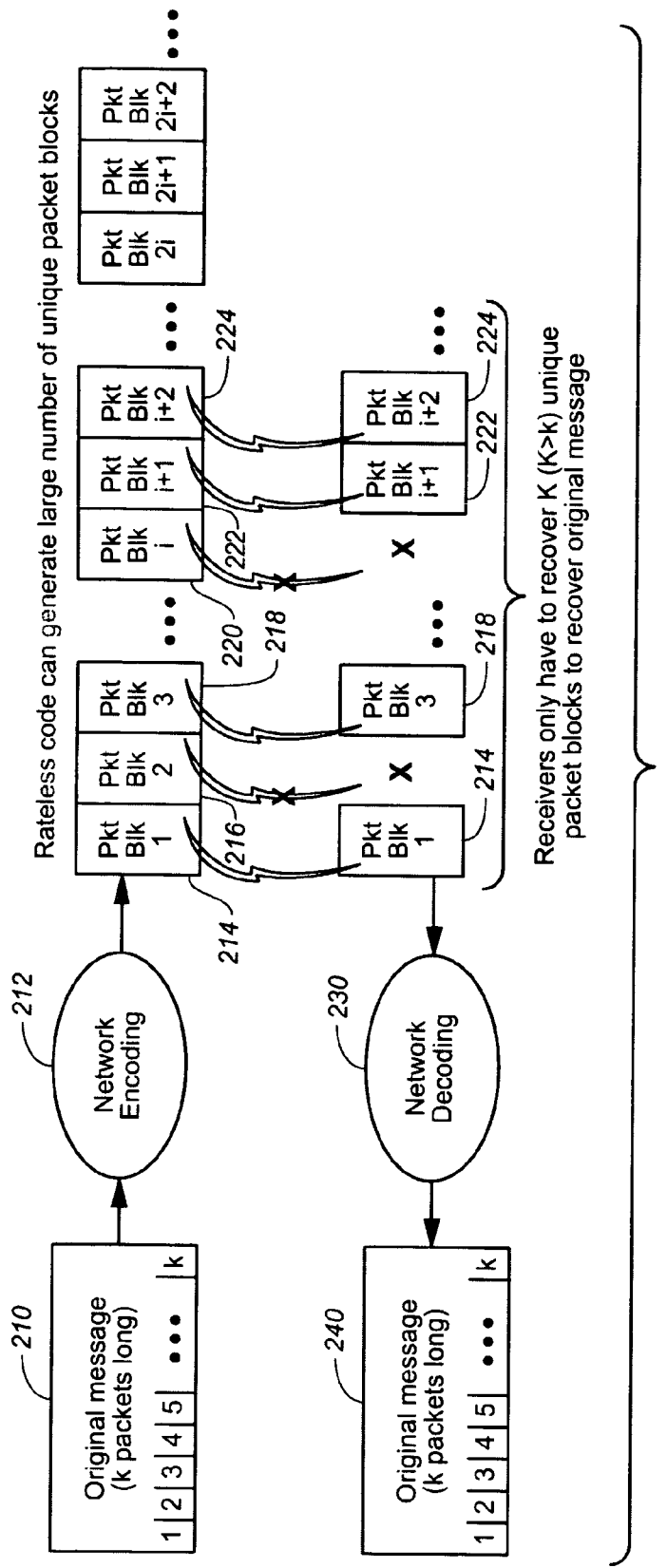
FIG. 2 is a conceptual diagram of how a rateless erasure code is used in network encoding and decoding of a packet switched message to recover a message that loses packets.

The present invention takes advantage of recent breakthroughs in low-rate and rateless erasure codes (of which fountain codes are the most well known example) to support reliable multicast and broadcast traffic over error-prone links, as shown in FIG. 2. In addition, the use of fountain codes is proposed to reduce the number of retransmissions required for reliable multi-hop (relayed) communications as well for multicast and also unicast traffic.

Thus FIG. 2 shows how a rateless erasure code (such as a fountain code) is used at the network encoding and decoding of a message comprised of packet blocks. Other types of codes besides a rateless erasure code could be used, such as a systematic Reed Solomon code with a long error correction sequence that would look like a "rateless code" as long as the message is correctly received prior to having to send all of the correction packets. The original message 210 is k packets long which will be sampled and sent out over the network, in encoded form, forming collectively a bitstream of data. The message can comprise any data, and itself can form part of a larger data collection. The original message 210 can be termed a "block of k source packets" which will be encoded into a stream of K encoded packet blocks (K>k) by a rateless erasure code, preferably a fountain code. The bitstream is encoded by network encoding block 212, which may be hardware and/or software, at the transmitter source node, and decoded by networking decoding block 230 at the receiver destination node, to yield original message 240, which should be identical to original message 210. In between the source and destination nodes a plurality of intermediate transceiver nodes relay the unique packet blocks, such as packet blocks 214, 216, 218, 220, 222, 224 and so on, as shown, which constitute the packet blocks comprising the encoded bitstream. The packet blocks are generated by an erasure code, preferably a fountain code (but may also include any other code, including a Reed Solomon code), which has the property that a long sequence of encoding symbols can be generated from a given set of source signals, such that the original source symbols can be recovered from any subset of the encoding signals, of size equal to or slightly larger than the number of source symbols. Rateless erasure codes use encoded symbols, generated by a seed or rateless code sequence. Rateless erasure codes can be generated practically ad infinitum and need not repeat. The net effect of employing a rateless erasure code such as a fountain code is that if certain packet blocks of the encoded bitstream are lost during transmission, such as in FIG. 2 packet blocks 216, 220 as shown by the "x" in the figure, the original message can be nevertheless recovered from the remaining packet blocks, so long as a predetermined number K unique packet blocks are recovered (with K>k). This property also reduces the number of multicast transmissions that are required (when compared to prior art techniques) because each destination need not received retransmissions of the specific packets that it has lost (which in FIG. 2 would be packet blocks 216, 220); it is sufficient that the other blocks be received (with K>k) for the original message to be reconstructed. Furthermore, a different set of packet blocks may be selected for relay traffic in a multicast, allowing nodes that have a bad link from the source to take advantage of any overheard packet that are received in the original multicast.

Erasure codes can generate a large number of unique encoded packet blocks from a single message. The message can be recovered from any set of K packet blocks. This property reduces the number of multicast retransmissions that are required because each destination need not receive retransmissions of the specific packets that it has lost. The concept is to allow relaying nodes that employ rateless erasure codes to receive a complete message from a source node, but start their transmission later in the rateless code sequence so that the same encoded packet is never retransmitted in the network to increase the effectiveness of each packet that is transmitted. One way of ensuring the same packet is never retransmitted in the network, but by no means the only way, is to assume k original packets and assume that a node will never have to transmit more than L packets to get a packet reliably delivered to all neighbors. For a very large possible sequence of encoded blocks, a node could start transmitting at sequence number I where I=tx node ID*Nk. (i.e. a function of the transmit node ID). This scheme—one of many that could be incorporated by the present invention and by no means the only such scheme—would ensure each node transmits in a different part of the sequence space and does not employ the same encoding sequence in a rateless erasure code.

Thus, one aspect of the present invention is to employ a rateless erasure code in the intermediate nodes in such a way as for the intermediate nodes (i.e., the relaying nodes) to receive a complete message, but to start their transmission later in the rateless code sequence so that the same encoded packet is never retransmitted in the network. In the event an encoded packet is lost, the relaying node, upon notification from another relaying node that a packet is lost, simply transmits another packet of the bitstream as encoded by the erasure code (by starting their transmission later in the code sequence), with the other retransmitted packet different from the lost packet in bits, but sufficient for the destination node to ultimately reconstruct the original message.

Figure 3:
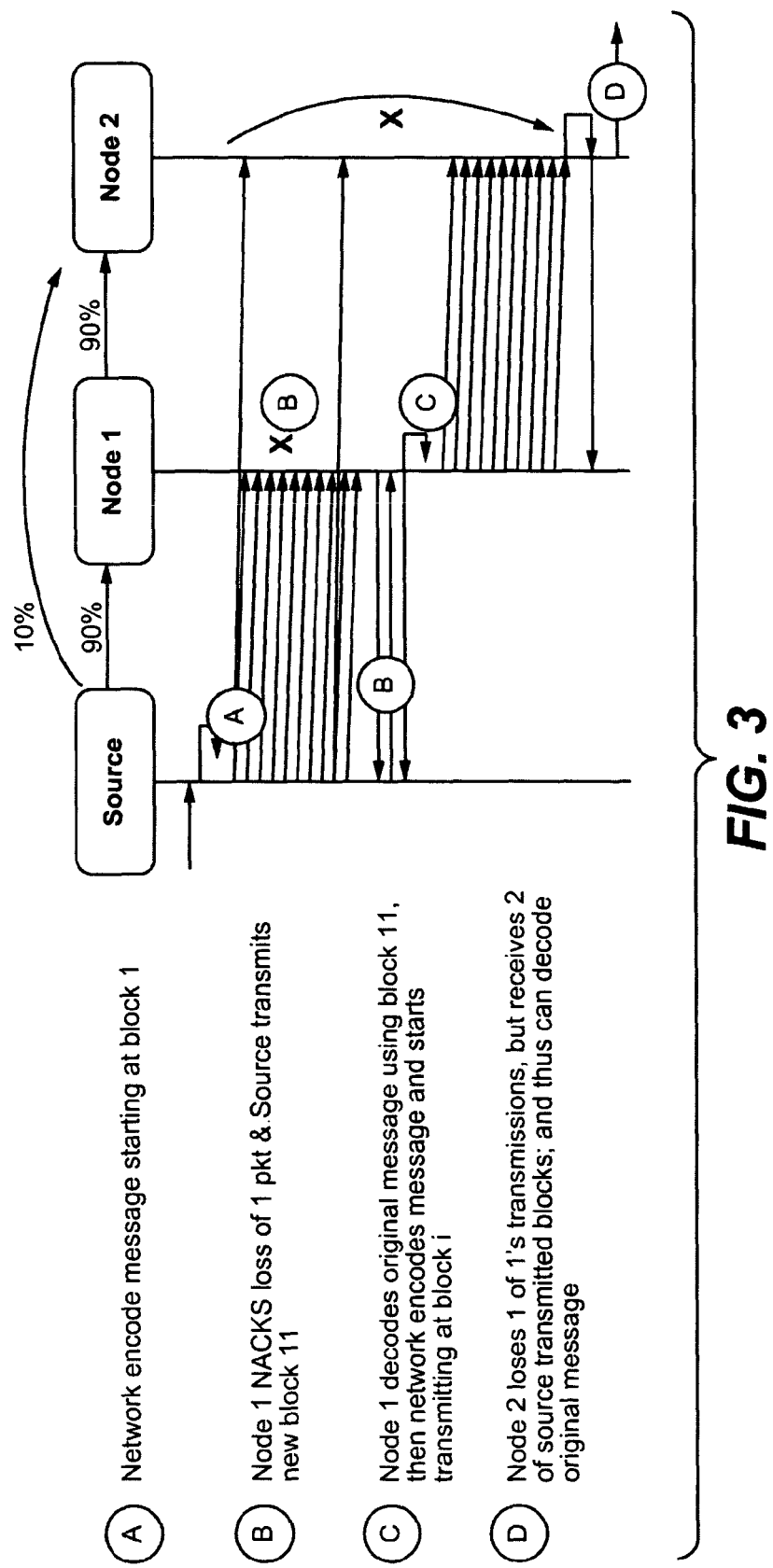
FIG. 3 shows a conceptual diagram of how a message is reconstructed in the present invention between nodes that use ACK/NAK codes to acknowledge message transfer.

Turning attention to FIG. 3, there is shown a simple conceptual diagram of how a message may be reconstructed in the present invention between nodes that use ACK/NAK codes to acknowledge message transfer. The example of FIG. 3 is not intended to limit the invention to just this example, but is illustrative. Thus in step A, a network encoded message in the form of a plurality of packet blocks (in this example, 10 packet blocks constitute the message, as indicated by the ten lines between Source and Node 1 in the figure. The packet blocks form a bitstream and are transmitted by a source node labeled "Source", to a another node labeled "Node 1", with the objective of relaying the message to a destination node, Node 2. The message packet blocks are encoded with a rateless erasure code, preferably a fountain code. Node 1 may optionally employ ACK/NAK communications protocol (since the nodes are not on the same MAC or link). Suppose that a packet block, block 1, from the message bitstream is lost. As indicated in step B, Node 1 would acknowledge a packet block was lost with a NAK, and the Source node would transmit a new block 11. Note the new block 11 is not the same as the old block 1, as a different sequence from the fountain code is used to encode the block 11; however, block 11 has enough information to allow, in conjunction with the other blocks, a reconstruction of the original message at either the ultimate destination, or, at Node 1. As a practical matter, it should be noted that though mathematically it might be possible to create a subset of new packets without recovering the complete original message at an intermediate node, such as Node 1, this is difficult and the preferred embodiment is to recover the original message at each intermediate node before the intermediate node (e.g., Node 1) starts to transmit the next message, so that the intermediate node can determine the new positioning in the rateless erasure code. This is believed to maximally reduce overhead and increase throughput. However, in the most general case it will be assumed that even a partial recovery of less than the complete original message will be possible at an intermediate node, even though this is not the preferred embodiment. The preferred embodiment, for reduced overhead and increased throughput, is to decode and recover the complete message at each intermediate node(s), before retransmission, from source to destination node(s).

Thus in FIG. 3 Node 1 would decode the original message using the new block 11, and Node 1 would encode the message using a new sequence (seed) from the fountain code (different from the fountain code sequence employed by the Source node to encode the blocks) and would start transmitting this encoded bitstream at a block "i", as shown in step C. Thus Node 1 would not retransmit the same encoded packet blocks as the Source node.

As indicated in step D of FIG. 3, another node (typically, but not necessarily, a bad neighboring node), Node 2, would receive the transmissions from Node 1. In this example, Node 2 loses one of Node 1's transmissions. Since some blocks are missing, Node 2 now checks to see if additional blocks are received from nodes other than Node 1, listening for overheard blocks. In this case, as indicated by the arrow marked "10%" in FIG. 3, Node 2 receives certain overheard blocks and additional blocks directly from the Source node. Node 2 thus can, in this example, reconstruct the missing blocks from Node 1 using the additional blocks received from the Source node. Due to the properties of rateless erasure codes (specifically fountain codes) the fact that the additional blocks received at Node 2 may be different from the blocks missing at Node 2 is not necessarily fatal to decoding and reconstructing the original message, as long as all the criteria for reconstructing the message are present (chiefly, so long as a predetermined number K unique encoded packet blocks are recovered from the message of k packets, with K>k).

The present invention may be used to reduce retransmissions required to support reliable multicast. For example, a source node S transmits a block of packets (Pkt1, Pkt2, Pkt3, ... Pkt128) to a group of destinations (D1, D2, D2, ... D10) across wireless links with low packet error rates (PER—Packet Error Rate). Here 'packet' is used interchangeably with 'packet block' as illustrated in FIG. 2, as is understandable to one of ordinary skill from the teachings herein. Packet block is a phrase to indicate encoded data packets as compared to original source unencoded data packets. Equivalently, one could use the terms coded and unencoded packets, as understood by one of ordinary skill from the teachings herein.

Each destination loses a small number (say 5 to 20) of the transmitted packets, where the destinations lose different packets (so that a total of 100 packets were lost across all 10 destinations). Without networking encoding, the source would have to retransmit the original 100 lost packets. With network encoding, the source only has to transmit 20 new encoded packets. Fountain Code usage (i) starts encoding over at relay nodes (for hop-by-hop reliability) or (ii) relays the original encoded packets (for end-to-end reliability). Both hurt the use of overheard packets to reduce retransmissions in multihop networks, unless resolved as disclosed herein by the present invention, where each relay node (intermediate node) decodes and encodes packets so that the same packet is not relayed and retransmitted twice (never repeated), but instead the rateless erasure code (fountain code) is used to encode the data encapsulated by the packet by moving further out into the rateless code sequence algorithm so the packet is different. Hence, using the present invention methodology, military applications using a multihop Network FEC Coding are particularly applicable, such as in military tactical networks where the majority of traffic is multicast.

Further, the present invention allows intermediate relay nodes to take advantage of overheard packets when retransmitting data and incorporate the information in these overheard packets when retransmitting data, thus using any overheard packets in the error detection-correction encoding of the packets. In addition, there is no need for intermediate nodes that utilize such overheard packets to know the state of any neighboring node or receiver node.

FIGS. 4A, 4B, 4C, 4D, 4E, and 4F show program flow according to one embodiment of the present invention, and by no means the only embodiment. The method of the present invention could be implemented in a software program (e.g. a SDR) and/or hardware or firmware at each node.

Figure 4A:
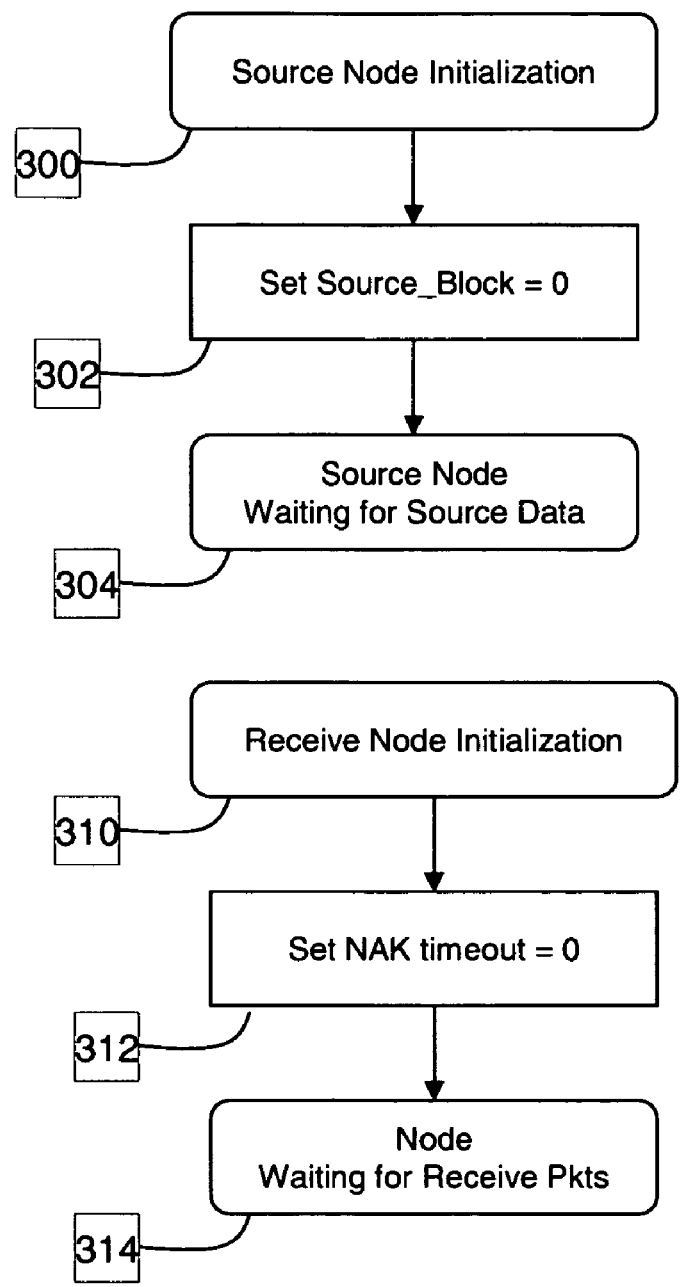
FIGS. 4A-4F are simplified flowcharts of sending a packet block according to method of the present invention.

Thus turning attention to FIG. 4A, there is shown how nodes initialize their state variables upon initialization in steps 300, 302, and 304 for source nodes and steps 310, 312, and 314 for receive nodes. Although nodes may only fulfill one role, e.g. source or receiver, in general a node fulfills both roles simultaneously. Source_block is a sequence number used at source nodes to identify individual message blocks of source data to transmit. The NAK_timeout counts up to when it is time for receiver nodes to send ACK/NAKs.

Figure 4B:
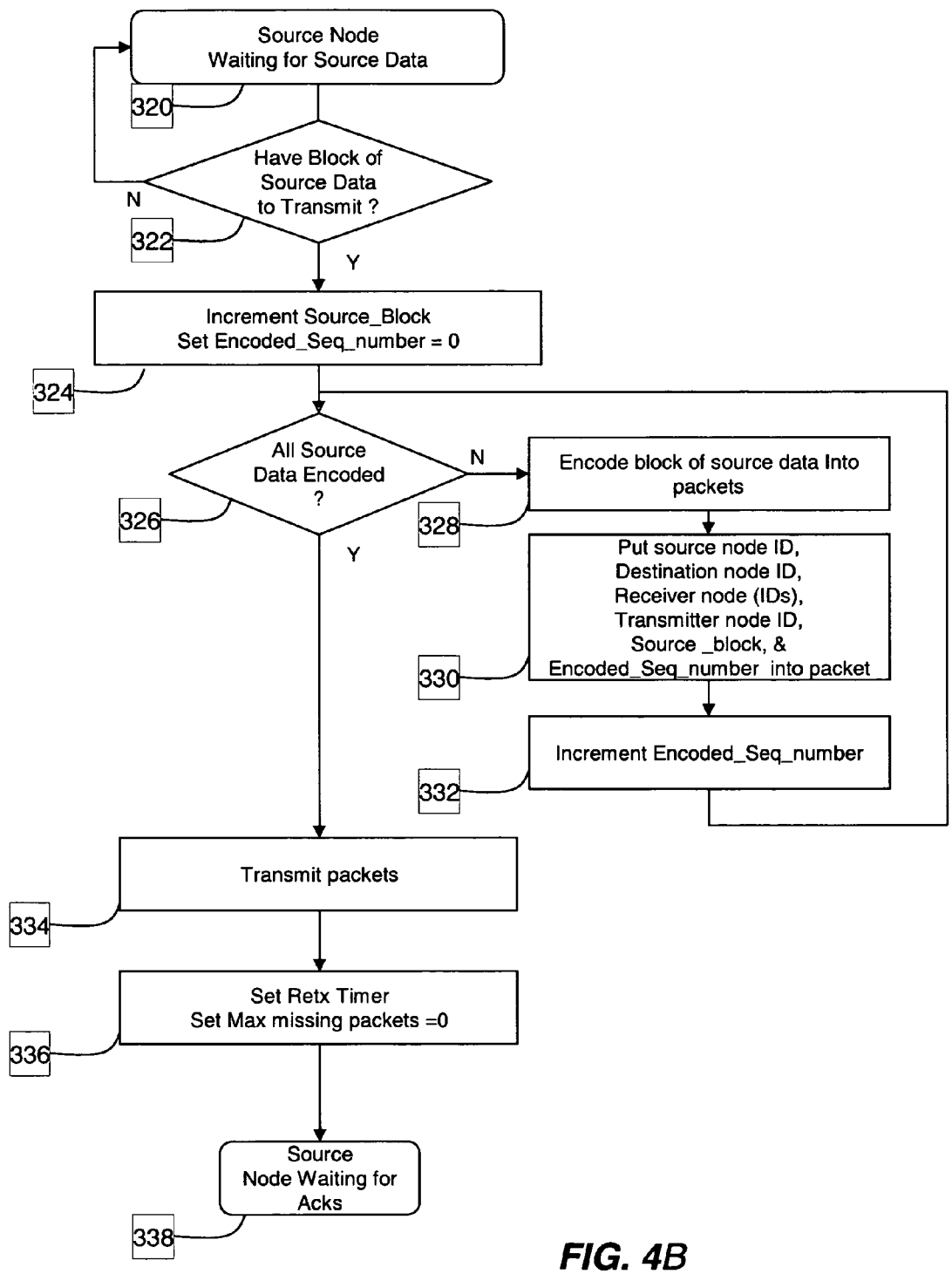

In steps 320 and 322 of FIG. 4B, a source node waits for source data to transmit. Although not shown or required, a source node could also wait to collect sufficient source data to obtain a minimum size source data to encode to improve efficiency. Once a source node has data to send, in step 324, a source node increments the Source_block to indicate the sequence number of the new source data. In step 328, a source node encodes the block of source data into separate packets to transmit. In block 330, a source node builds a packet header containing source node ID of the data and the destination node ID of the data (or destination node IDs for multicast and broadcast data). The destination node ID is either equal to the destination node ID of the source data or found through an address look-up table. The combination of source node ID and Source_block uniquely identify which particular source data message this packet is part of. In step 330, the Encoded_Seq_number uniquely identifies a transmitted packet from all other transmitted packets and corresponds to the numbers 1, 2, 3, ..., I, i+1, i+2, ... 2i, 2i+1, 2i+2, ... in FIG. 2. The Encoded_seq_number is incremented for every packet in step 332. Once all of the source data is encoded in steps 326, 328, 330, 332, then the packets are transmitted in step 334. The receiver_node_IDs are the addresses of the neighbor nodes that are to receive the packets and send back ACKs/NAKs. The receiver_node_IDs for the set of destination node IDs is found through a routing table lookup. The transmitter_node_ID is set equal to the node ID of the source node. In step 336, a Retx_timer is set to indicate when the source node should try to retransmit missing data. Max_missing_packets tracks the maximum number of packets that were lost by any of the receiver nodes and is set to zero in step 336 prior to waiting for ACKs.

Figure 4C:
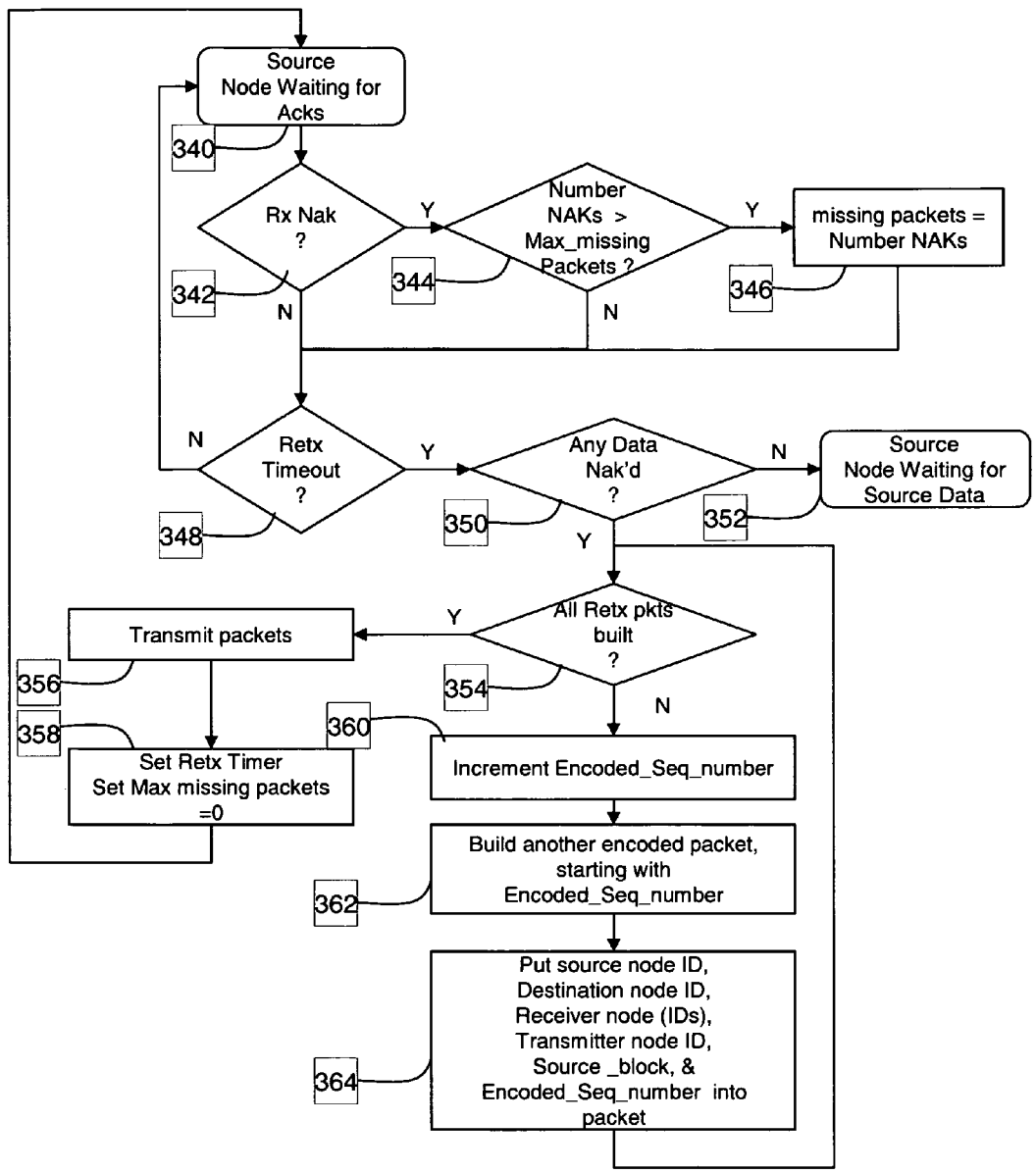

In FIG. 4C, the source node waits for Acks to ensure reliable delivery to the receiver nodes. Upon receipt of a NAK/ACk in step 342, the source node in step 344 looks to see if the NAKing node lost more packets than the nodes that have previously sent in ACK/NAKs. If the number is greater, then the number of missing_packets is set equal to the number of packets that are NAKd in step 346.

In step 348, upon expiration of the Retransmit Timeout, the source node looks to see if any data were NAK'd. in step 350. Data was NAK'd if missing_packets is greater than zero. If no data was NAK'd then the source node goes back to waiting for data to send in step 352. In steps 354, 360, 362, and 364, the source node builds additional encoded packets of parity information to satisfy the receiver node (or nodes) that had the most missing packets. As shown in step 360 and 362, the source node starts encoding additional packets later in the sequence than where it had stopped before. This allows receivers to recover any missing packet block based on upon the additional code information, such as additional parity from a fountain code sequence. The packet header is set in step 364. Once all the necessary parity packets are built, the packets are transmitted in step 356. In step 358, the source node resets the Retx_timer and zeroizes the Max_missing_packets to wait for the next round of ACK/NAKs from its neighboring node.

Figure 4D:
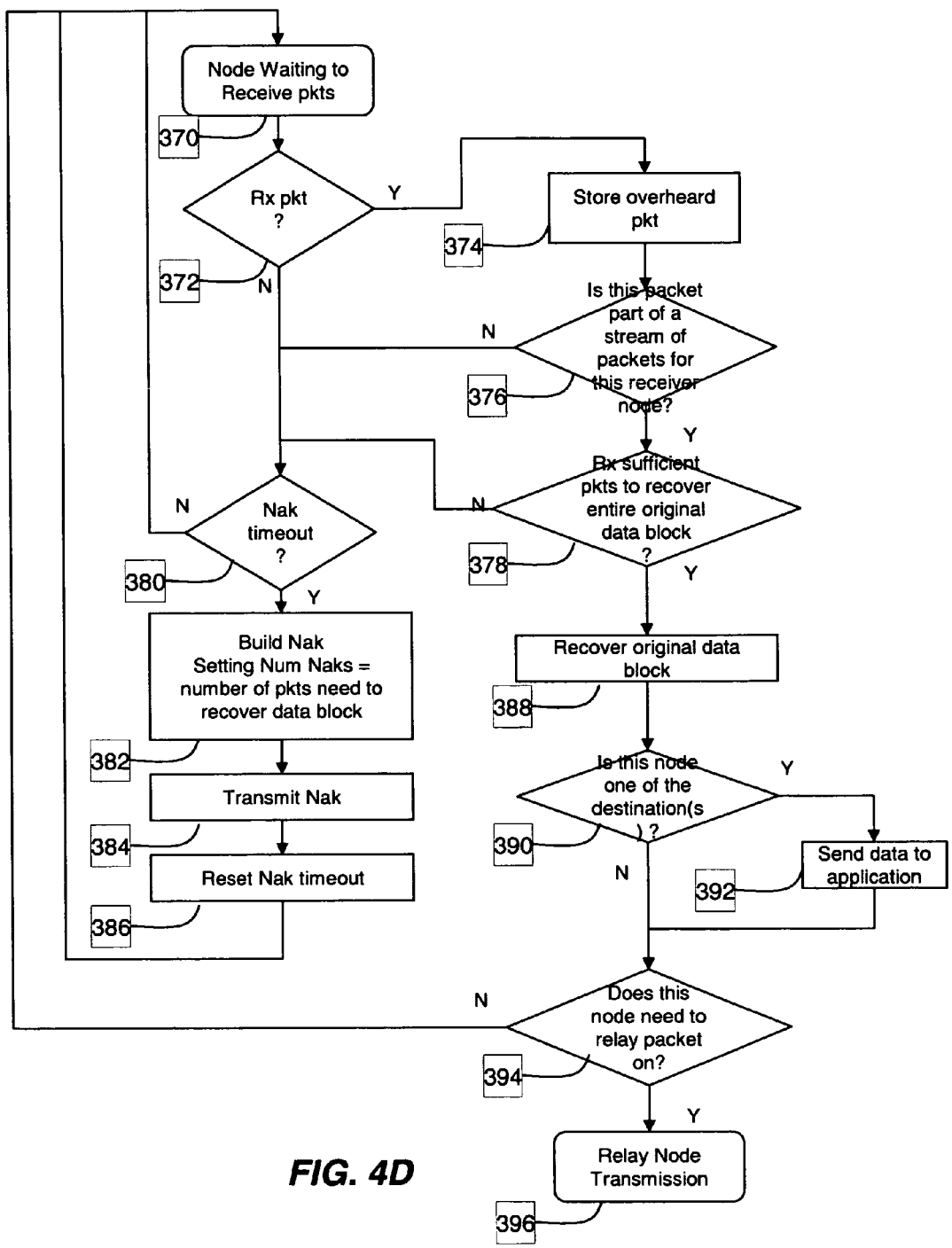

FIG. 4D shows the steps for receiver nodes. In steps 372 and 374, a receiver node store packets they receive correctly without errors. In step 376, a receiver node checks to see if the received packet is part of a stream of packets to which the receiver node is an intended receiver. A received packet is part of such as stream if the receiver node's ID is part of the received packet's receiver_node_IDs or the received packet source node ID and source_block are the same as earlier packets that this receiver node had received in which it was an intended receiver.

In step 380, the receiver node checks to see if it needs to send a NAK back to the transmitting node. If the NAK timeout has occurred, the receiver node builds a NAK in step 382 that indicates the number of packets it needs to recover the original source data. The receiver node transmits the NAK in step 384 and resets it NAK timer in step 386 and waits to receive the additional packets in step 370.

In step 378, a receiver nodes checks to see if it has received sufficient packets to recover the entire original data block. Once sufficient packet blocks are received, the receiver/relay node practicing the method of the present invention will decode the packet blocks to recover the underlying packets (message). At this point, the original message is recovered. The encoded message packet blocks sent out by any intermediate node are never the same packet blocks sent by its neighbors, even if the underlying encoded original message may be the same in the neighboring nodes, as when a multicast is being transmitted.

If it has, then it decodes the source message from the received data in block 388 using the FEC information that is encoded across the received packets. In step 390, if this node is one of the destinations (its node ID is one of the Destination node IDs), then it sends the data to the local application in step 392. In step 394, the receiving node determines if it needs to relay the packet on to the remaining destinations by any of several methods, including looking into a routing table (such as a multicast spanning tree). If the data needs to be relayed, then the receiver node go to the relay node transmission steps starting at step 400 in FIG. 4E.

Figure 4E:
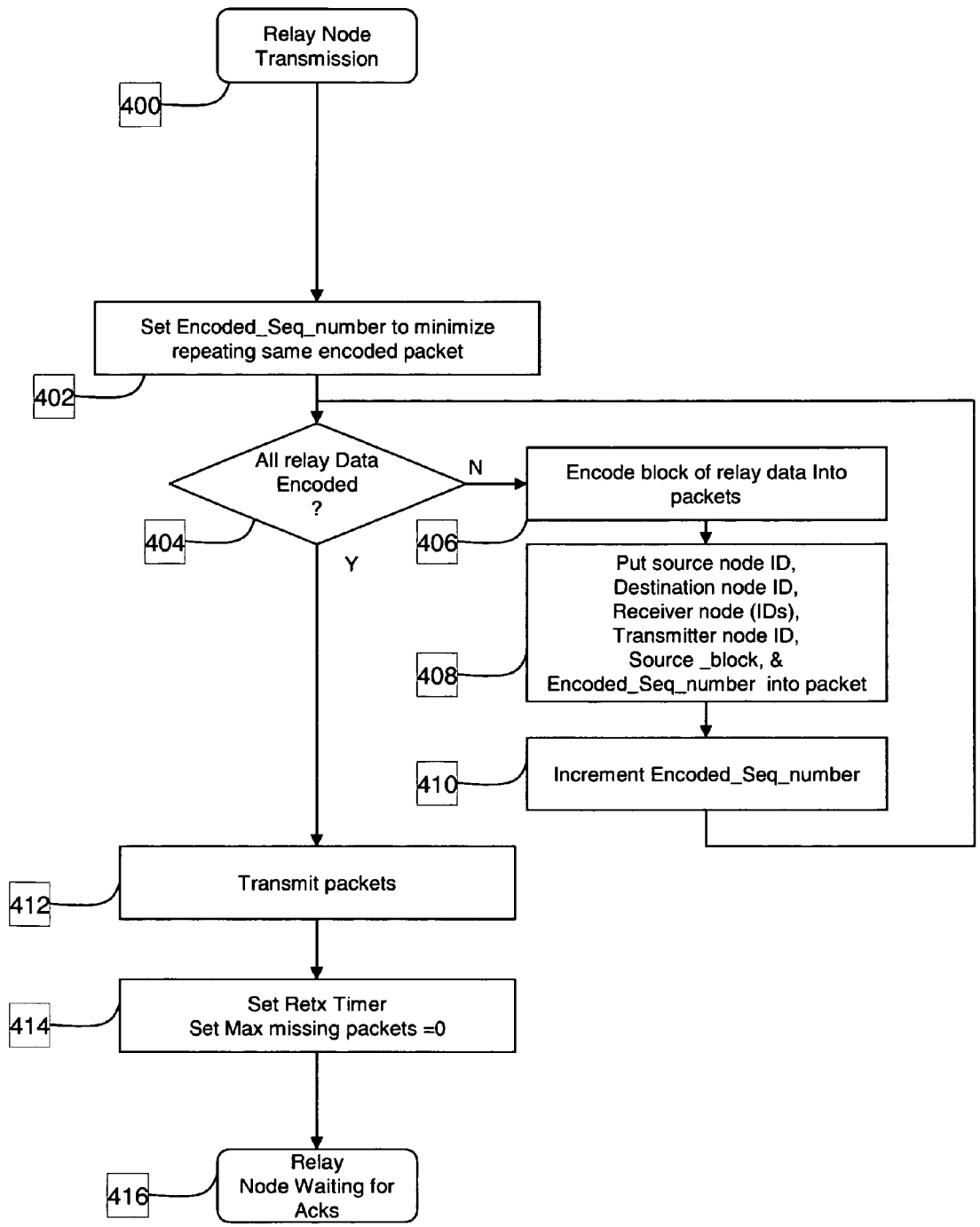

In step 402 of FIG. 4E, the relay node sets its Encoded_Seq_number to ensure that its transmissions are farther along in the originally encoded sequence so that no other nodes transmit duplicate data/parity information. One way of ensuring the same packet is never retransmitted in the network, that is, using a different sequence, but by no means the only way, is to assume k original packets and assume that a node will never have to transmit more than L packets to get a packet reliably delivered to all neighbors. For a very large possible sequence of encoded blocks, a node could start transmitting at sequence number I where I=tx node ID*Nk. (i.e. a function of the transmit node ID). This scheme—one of many that could be incorporated by the present invention and by no means the only such scheme—would ensure each node transmits in a different part of the sequence space and does not employ the same encoding sequence in a rateless erasure code. In steps 404, 406, 408, and 410, the relay node encodes the data into packets similar to how the source did, with the exception that the source node ID, and source_block number remain set to what the source node originally set them to. In step 412 the packets are transmitted and in step 414, the relay node sets its Retx_timer and Max_missing_packets to start waiting for ACKs.

Figure 4F:
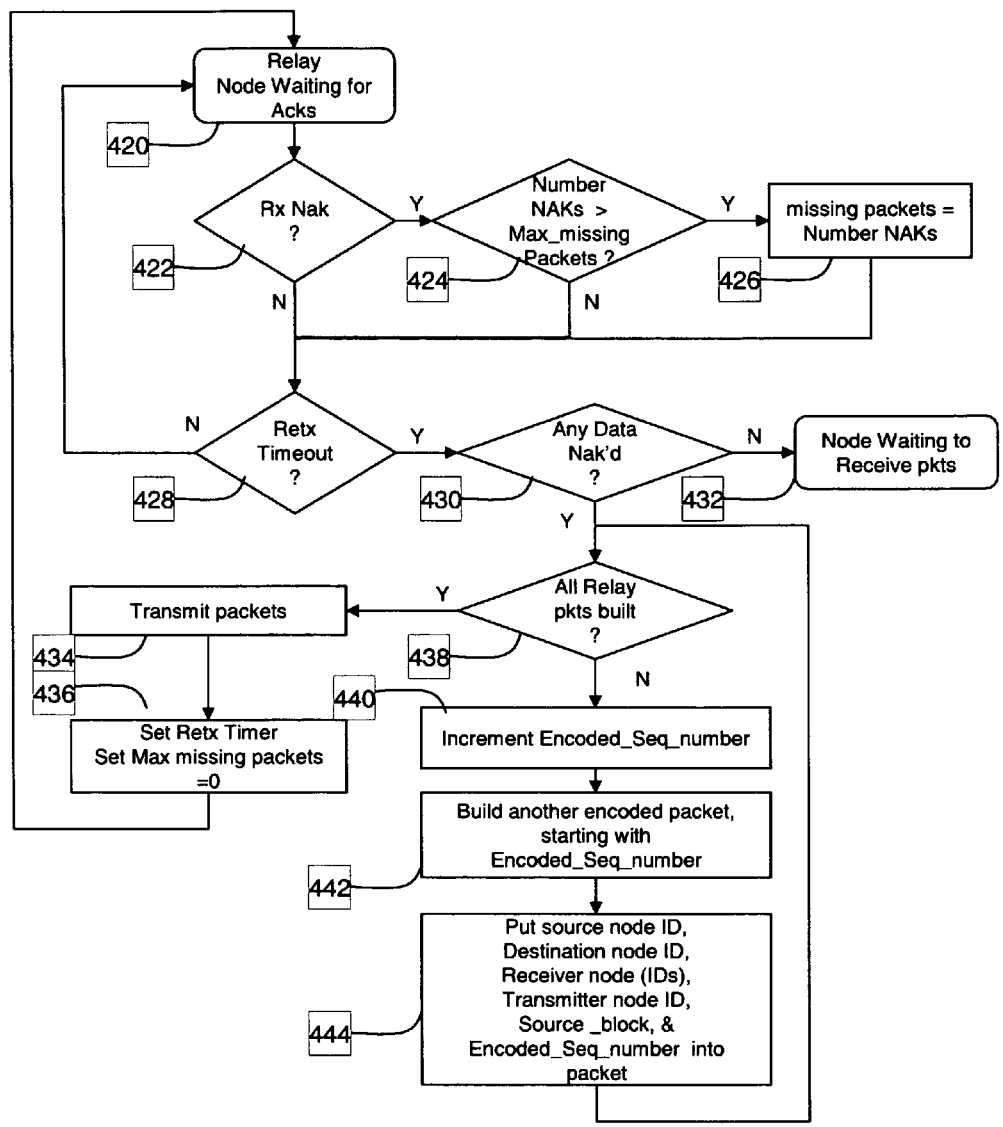

In FIG. 4F, the relay node waits for acknowledgments in similar manner to that shown for the source node in FIG. 4C.

The method represented in FIG. 4 in a simplified manner as a procedural process, but the method could also be event driven (with suitable count-down timers to trigger events), thus the steps in FIG. 4 could correspond to one or more software modules that perform the functions outlined therein. Alternatively, the method represented in FIG. 4 could be implemented as a state machine with a node performing all of the source, receiver, relay, and destination node processing in parallel depending upon what source and receiver data arrives at any given time.

Figure 5:
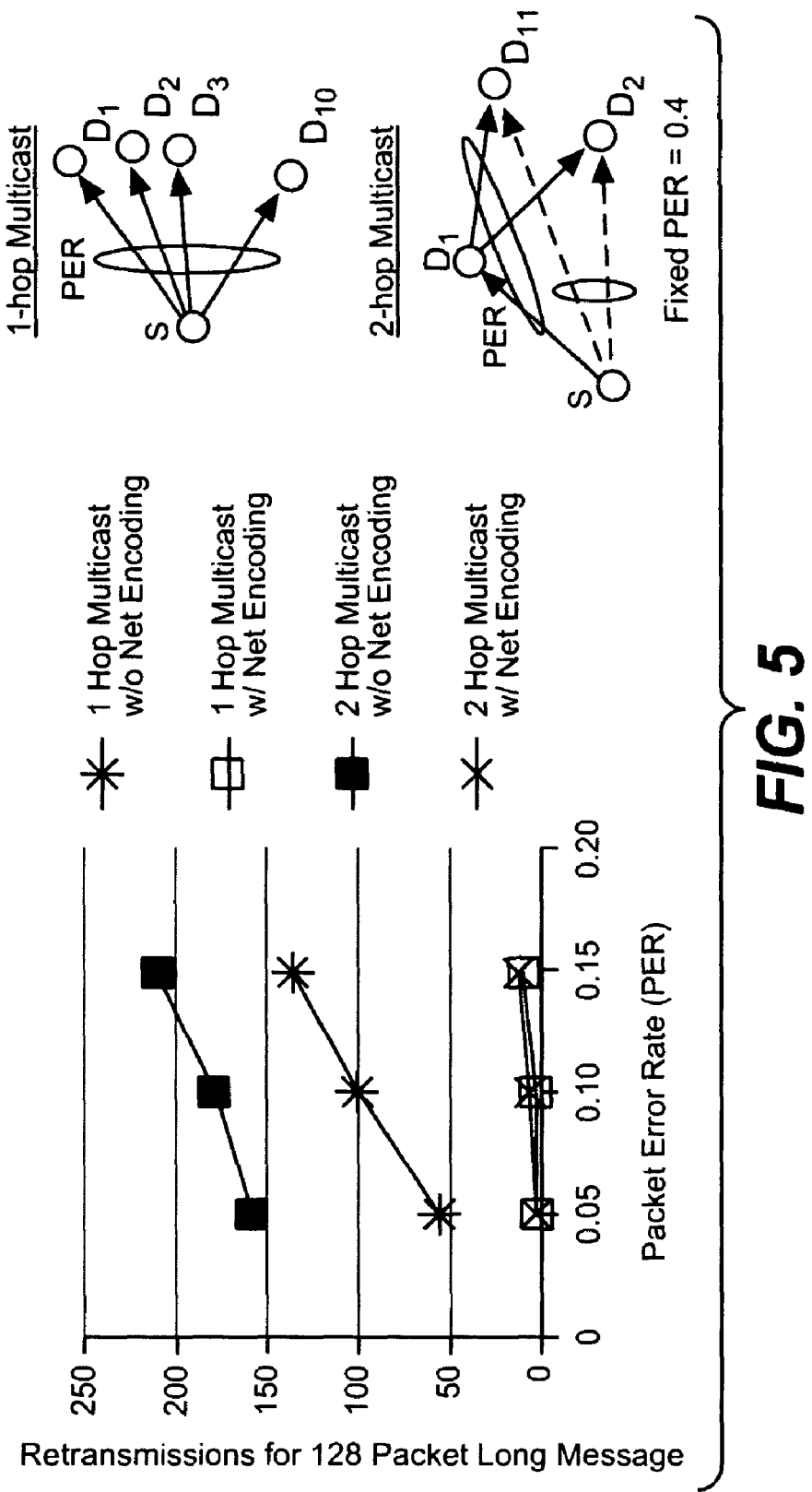
FIG. 5 is a graph showing the performance enhancement that can occur when employing the present invention.

FIG. 5 illustrates the significant reduction in retransmissions required to achieve reliable message delivery for two specific multicast scenarios. FIG. 5 shows retransmissions required for multicast delivery both with and without network FEC encoding for two nominal network topologies: a 1-hop multicast and a 2-hop multicast, (shown in the upper right corner of FIG. 5, with S=Source node and Di=Destination node). Performance Improvement in Packet Error Rate (PER) for the links used in forwarding is varied from 5 to 15%. PER for the poor 1-hop link between the source & 2-hop destinations is held at 40%. Packets are forwarded hop-by-hop and ACK'd/NAK'd across links. For the two cases without Net Encoding, as indicated in the legend in FIG. 5, lost packets across all destinations are retransmitted. For the two cases with Net Encoding, the 128 packets are FEC encoded and the encoded packets are forwarded. Only enough new encoded packets are transmitted to cover just the maximum number of packets lost at any destination (instead of all packets lost across all destinations). In the fourth case, the relay node creates new encoded packets, rather than repeating the originally encoded packets, so that the 2-hop destinations can take advantage of overheard packets.

While the present invention uses fountain codes, other codes are also employable so long as intermediate nodes have the ability to retransmit packets lost in a bit stream without having to repeat the packets lost. Thus Reed Solomon codes may be employed, and the use of any FEC coding such that all retransmissions—whether for ACKing and/or for forwarding/relaying) extend from the same sequence/ensemble of FEC code blocks such that the identical retransmitted packets are not repeated.

The present invention is especially useful in multihop, multicast/broadcast delivery, but it will also work for multihop, unicast delivery, or single-hop multicast/unicast/broadcast. The present invention is especially useful with low density parity checksum (LDPC) codes, like fountain codes, but may be used with any long cycle FEC block code (even Reed Solomon with a long repeat cycle); if the FEC block codes repeats, then the invention is to not start over when retransmitting or forwarding packet blocks, but continue in cycle from the last (or after last) place used.

The present invention may be used be combined with ARQ (ack & retx) protocols, especially hop-by-hop or link level ARQ. Conversely, the present invention may be used without any ARQ.

The present invention may be combined with multicast routing, broadcast routing and flooding algorithms.

The present invention is described for a single media network (such as IEEE 802.11, SDR or packet radio), however it could be used across multiple radio-frequency media for nodes/platforms that can receive multiple radiofrequency networks concurrently (in parallel) or serially.

The present invention may be used without any a priori knowledge of the channel conditions, conversely the present invention may be used with a priori knowledge of the channel conditions, in which case the a priori knowledge is used to select the particular FEC code properties (or number of initial transmissions) to tailor it for the particular channel.

The present invention is useful for binary block erasure channels (either receive packet or not—i.e. without any physical layer history); but the invention could also be used with other channel types, e.g., non-binary erasure channels (although this can significantly increase physical layer memory and processing).

The present invention typically is used at the OSI layers 2 & 3a (data link and subnet) without physical layer cooperative transmissions. It may, however, also include physical layer cooperation as well (this will typically imply operation in something other than a binary block erasure channel).

It is intended that the scope of the present invention extends to all such modifications and/or additions and that the scope of the present invention is limited solely by the claims set forth below.

I claim:

1. A wireless communications network comprising:
a plurality of nodes forming a wireless network of transceivers, said plurality of nodes transmitting and receiving data packets, said data packets encoded by a error detection-correction encoding scheme at said plurality of nodes, said plurality of nodes comprising:
at least one originating source node transmitting said encoded data packets, said source node transmitting a message consisting of a predetermined number of packet blocks forming a complete message;
at least one destination node for receiving said encoded data packets; and
at least one intermediate node part of said network to retransmit data packets, said intermediate node between said at least one originating source node and said at least one destination node, said at least one intermediate node:
encoding said data packets received with said error detection-correcting encoding scheme, said encoding the data packets received for retransmission encodes the data packets for retransmission to be different from the encoded data packets received;
receiving overheard packets from other nodes in said network;
incorporating information in the overheard packets when retransmitting said data packets; and
decoding and recovering the complete message prior to retransmission of said complete message,
wherein said plurality of nodes incorporate said overheard packets in said transmission of said data packets.

2. The wireless communications network according to claim 1, wherein:
said error detection-correction encoding scheme is selected from the group of encoding schemes consisting of Fountain codes, raptor codes, Reed-Solomon codes, LDPC codes, and a rateful code.

3. The wireless communications network according to claim 1, wherein:
said error detection-correction encoding scheme is a Fountain code, and said intermediate node encodes said data packets by moving further out into the rateless code sequence associated with the Fountain code.

4. The wireless communications network according to claim 3, further comprising:
an ID associated with each of said plurality of nodes forming said wireless network of transceivers;
said Fountain code error detection-correction encoding scheme employs moving further out into the rateless code sequence by each of said transceiver nodes by using said ID associated with each of said transceiver nodes.

5. The wireless communications network according to claim 1, wherein:
said originating source node transmits said data packets in a multicast.

6. A method for a wireless communications network comprising the steps of:
forming a network having a plurality of transceiver nodes comprising a originating source node, a destination node, and a relay node intermediate to the source and destination nodes;
transmitting and receiving data packets at each of the plurality of transceiver nodes, the data packets encoded by a error detection-correction encoding scheme at the plurality of transceiver nodes;
listening at the plurality of transceiver nodes for overheard packets in said network;
incorporating the overheard packets in any retransmission of the data packets at the plurality of transceiver nodes;
transmitting a message consisting of a predetermined number of packet blocks forming a complete message;
providing a plurality of relay nodes in the network;
decoding and recovering the complete message at each of said plurality of relay nodes prior to retransmission of the complete message.

7. The method according to claim 6, further comprising the steps of:
encoding the data packets at the plurality of transceiver nodes in such a manner that the no encoded data packet is ever transmitted twice in the network.

8. The method according to claim 6, further comprising the steps of:
encoding the data packets according to an error detection-correction encoding scheme selected from the group consisting of: Fountain codes, raptor codes, LDPC codes, Reed-Solomon codes, and a rateful code.

9. The method according to claim 7, further comprising the steps of:
encoding the data packets using a Fountain code;
providing a plurality of relay nodes in the network;
each of the plurality of relay nodes using a different part of the rateless code sequence associated with the Fountain code so that no data packet is ever encoded twice in exactly the same way.

10. The method according to claim 6, further comprising the steps of:
associating each of the plurality of transceiver nodes in the network with a unique ID;
moving further out in the rateless code sequence associated with the Fountain code for each transmitting node by using the unique ID associated with the transmitting node.

11. The method according to claim 6, further comprising the steps of:
transmitting the data packets at the originating source node to a plurality of destination nodes by way of a multicast.

12. The method according to claim 11, further comprising the steps of:
forming the network by letting the plurality of transceiver nodes self configure by way of a mobile ad hoc network (MANET).

13. The method according to claim 6, further comprising the steps of:
forming communication channels between the plurality of transceiver nodes;
ascertaining knowledge of channel conditions;
selecting and modifying the error detection-correction encoding scheme according to the ascertained channel conditions.

* * * * *